United States Patent [19]

Hoppe

[11] 4,292,523
[45] Sep. 29, 1981

[54] SPECIMEN ADJUSTMENT METHOD AND SYSTEM FOR A CORPUSCULAR BEAM APPARATUS

[75] Inventor: Walter Hoppe, Lochham, Fed. Rep. of Germany

[73] Assignee: Max-Planck-Gesellshaft zur Forderung der Wissenschaften e.V., Fed. Rep. of Germany

[21] Appl. No.: 45,643

[22] Filed: Jun. 5, 1979

[30] Foreign Application Priority Data

Jun. 9, 1978 [DE] Fed. Rep. of Germany ....... 2825417

[51] Int. Cl.³ .............................................. G21K 5/10
[52] U.S. Cl. .................................. 250/442; 250/440
[58] Field of Search .............. 250/440, 442, 441, 451, 250/456, 311

[56] References Cited

U.S. PATENT DOCUMENTS 3,684,904 8/1972 Galutva et al. ...................... 250/442
3,745,341 7/1973 Sakitani ................................ 250/442
3,952,203 4/1976 Hoppe ................................. 250/442

Primary Examiner—Bruce C. Anderson
Attorney, Agent, or Firm—Brumbaugh, Graves, Donohue & Raymond

[57] ABSTRACT

In a method and system for adjustment of a specimen supported by a specimen support able to be changed over from one clutch state to another, the specimen is on a specimen table of an electronmicroscope or other corpuscular beam apparatus, and adjustment of the specimen table normal to a longitudinal axis of the apparatus is possible in two coordinate directions. The specimen support is first coupled to the specimen table which is then adjusted such that the specimen is put into a desired position in relation to the apparatus axis. The specimen support then is coupled up with a holding member, which, as long as the specimen support is joined to it, is generally fixed in position. The specimen table is then readjusted into a certain desired position and the specimen support is then again coupled with the specimen table.

10 Claims, 8 Drawing Figures

SPECIMEN ADJUSTMENT METHOD AND SYSTEM FOR A CORPUSCULAR BEAM APPARATUS

BACKGROUND OF THE INVENTION (1) Field covered by the invention

The present invention relates to a method and a system for the adjustment of a specimen supported by a specimen support able to be changed over from one clutch state to another, the specimen being on a specimen table of an electron microscope or other corpuscular beam apparatus, adjustment of the specimen table normal to a longitudinal axis of the apparatus being possible in two coordinate directions.

(2) The prior art

German Pat. No. 2,236,530 describes a specimen adjustment system for a corpuscular beam apparatus, as an electron microscope, which has a longitudinal apparatus axis, a specimen table and a tilting unit. The specimen table serves for adjusting a specimen support or mount, placed on it, in two directions normal to the apparatus axis, while the tilting system is used for tilting the table or the specimen support, placed on it, about a tilt axis essentially normal to the apparatus axis. The specimen table and the tilting unit are mechanically separated and the specimen support can be selectively coupled with the specimen table or the tilting unit. The specimen support is first coupled with the specimen table and then a desired part of the specimen is put into the desired position by moving the specimen table to which the specimen support is coupled, in relation to the apparatus axis. After this has been done, the specimen is coupled with the tilting unit, which may form a part of a microgoniometer. The specimen adjustment unit then makes possible an "eccentrical" positioning adjustment of the specimen, that is to say placing the specimen in the point of intersection of the tilting axis and a turning axis of the goniometer, which, in the zero position of the tilting system, generally coincides with the apparatus axis.

In the case of this known specimen adjustment system the joining of the specimen support with the specimen table or the tilting system is mechanical and may be selectively activated by a clutch. It has been suggested, however, that a clutch system of the above discussed general type be made wherein the coupling is performed by electrical force making use of the Johnsen-Rahbek effect (see "Electron Microscopy 1974, Abstracts of papers presented to the Eighth International Congress on Electron Microscopy, Canberra, 25th to 31st August 1974", publisher:

The Australian Academy of Science Canberra, A.C.T. Australia, Vol. I, pages 194 and 195).

In accordance with another earlier suggestion, a tilting and turning system, which are generally designed together in the form of a goniometer rod, of a goniometer ("tilt-turn goniometer") was to be bearinged in a frame, which may undergo adjustment into two coordinate directions (X and Y) normal to the apparatus axis and, generally speaking, furthermore parallel to the apparatus axis. This frame, moved in the X and Y directions, takes the form of a second or "operation" specimen table, which is present in addition to the firstly-noted "adjustment" specimen table.

Lastly, there has been another earlier suggestion to have, in place of the turning unit, a second tilting unit, whose axis is normal to the axis of the first tilting unit (rod axis) and to the apparatus axis. With such a goniometer design for two forms of tilt, the specimen may be lined up, in any possible way desired, with respect to the apparatus axis, on the same lines as in a turn-tilt goniometer.

THE INVENTION

It is an object of the present invention to provide a process and device in which the adjustment of a specimen, with respect to a corpuscular beam apparatus, may be made simpler and the design of parts necessary for the adjustment is made less complex.

Briefly, it will be seen that in the process of the invention, when made use of, the frame or operation specimen table is used for two purposes: that is to say it is used on the one hand initially for adjustment of the specimen and more specially for an eccentrical adjustment of the specimen, and on the other hand, as known, for adjustment of the goniometer. In a device according to the invention, it is, for this reason, not necessary to provide an adjustment specimen table to which the specimen support must be coupled when it is undergoing adjustment. In its place, use is made of a simple supporting part, which is only used for holding the specimen support in a fixed position relative to the apparatus. After the initial specimen table adjustment, and while the specimen table undergoes a further adjustment to put the specimen into the eccentrical or another desired position in relation to the apparatus axis or, if preferred, into a position which has been fixed beforehand.

The system according to the invention is very simple mechanically and is reliable in operation.

Drawing illustrating non-limiting embodiments of the invention, in which

Figure 1:
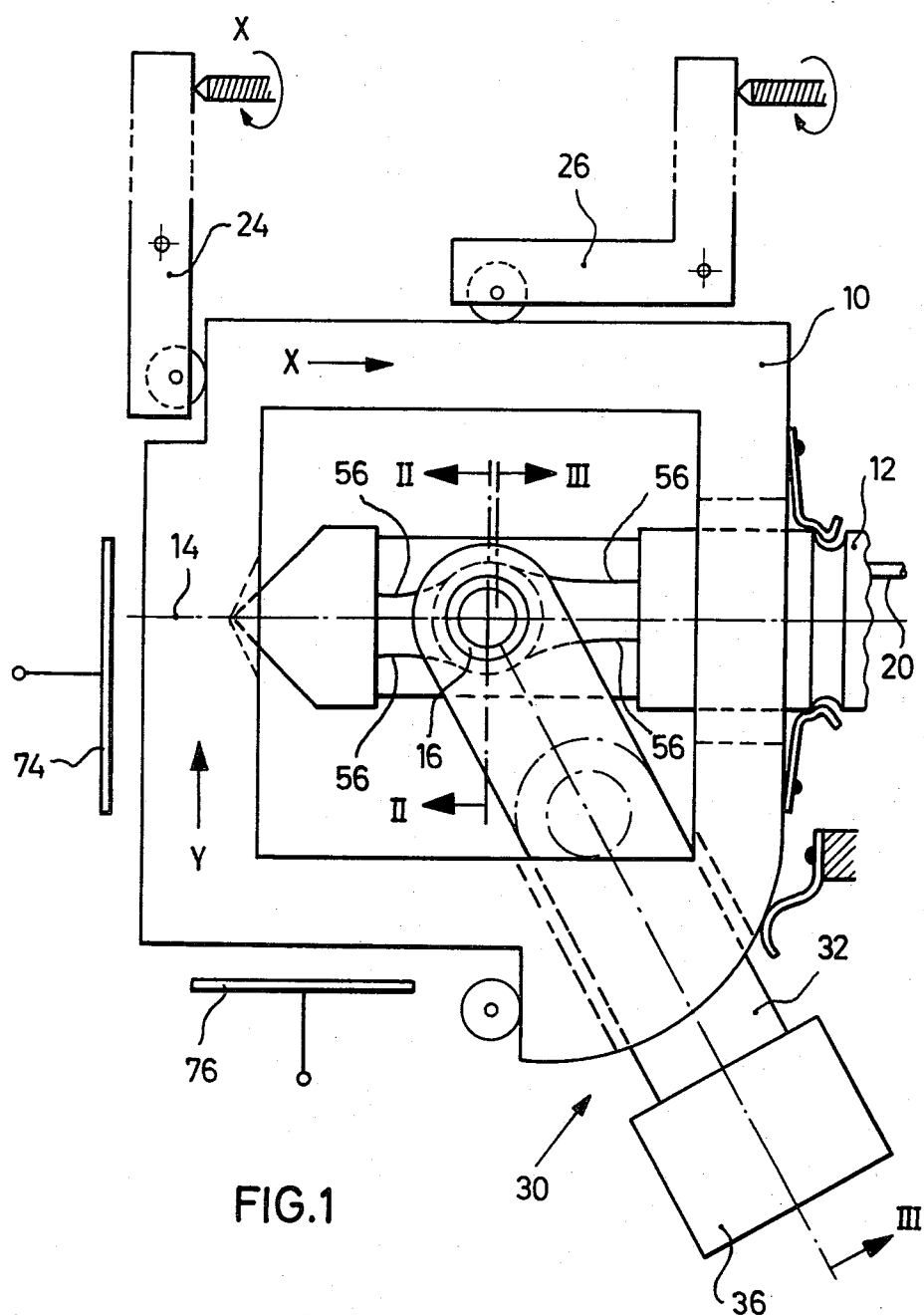
FIG. 1 is a diagrammatic plan view of a system according to a first embodiment of the invention.

A preferred use of the present system is in a transmission type electron microscope comprising a goniometer, in which case the system, which is shown diagrammatically in FIG. 1, is placed between the pole shoes of a magnetic objective lens of the electronmicroscope (not shown).

The system shown in a somewhat simplified manner comprises a frame or specimen table 10 and a device 12 which, in the art, is named a goniometer rod. The goniometer rod 12 can be tilted, by known means not shown in the figure, about a tilt axis 14 and has a rotatable insert or inner part 16, which, in operation supports a specimen holder or support 18. The goniometer rod has for example a worm driving system with a worm 19, fixed on a driving shaft 20 making it possible for inner part 16, having teeth for use with the worm, to be turned through a certain angle, for example ±10° about a Z-axis 21, so that if a specimen 22, supported on the specimen support 18, needs an eccentrical adjustment, that is to say is eccentrically positioned, the goniometer axes 14 and 21 will intersect at a point on the corpuscular beam apparatus axis. In the zero position, to be seen in FIG. 2, of goniometer rod 12 with respect to the tilt axis 14, the apparatus axis will coincide with the Z-axis 21. The specimen table 10 is supported, as known in the art, in the apparatus such that it, and the goniometer rod 12 supported on it, can be selectively adjusted by means of adjustment levers 24 and 26, in an X-direction and in an Y-direction, respectively.

Figure 3:
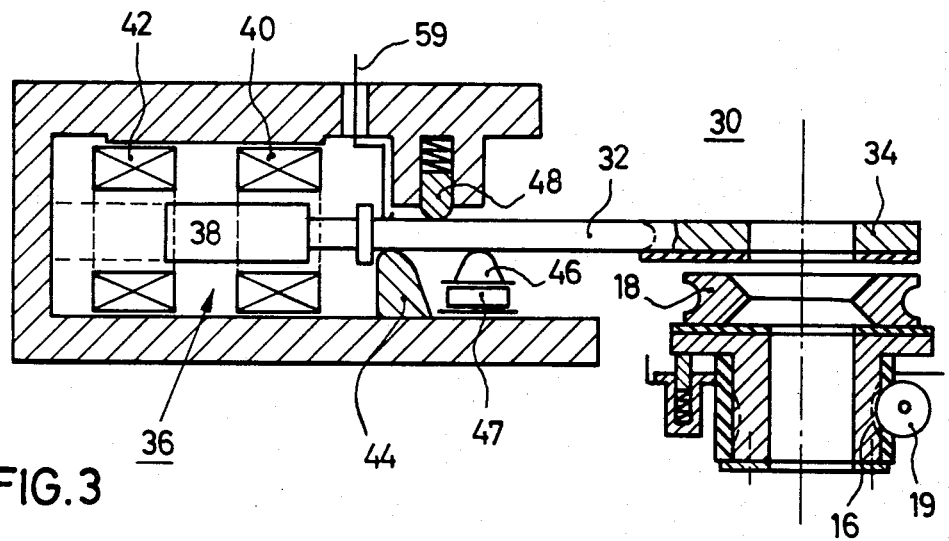
FIG. 3 is a section-view, taken on the section line III—III and not true to scale, of the system of FIG. 1.

Further, according to the invention, a coupling system 30 is provided for changing the coupling state, as will be seen in FIG. 3 in more detail. The clutch function changeover unit or coupling system 30 comprises a clutch plate 32 having an apertured front end 34 and being selectively movable by a positioning device 36 between an extended position (shown in full lines) and a retracted position (shown in broken lines). The positioning device may, for example, comprise a magnet core 38 joined with the clutch plate 32 and cooperating with two magnet coils 40 and 42, which, on being powered, have the effect of moving the clutch plate into the extended and, in the other case, into the retracted position. The clutch plate 32 is slidably supported between bearing jewels or stones, 44, 46 and 48. Of these bearing stones 44 and 46 are positioned on the one side, and the bearing stone 44 is fixed in position, while position of the bearing stone 46 can be adjusted and controlled in a direction normal to the plane of clutch plate 32, for example by means of a piezoelectric unit 47.

The bearing stone 48, positioned on the other side, is resiliently urged against the clutch plate 32.

The bearing stones 44 and 48 are positioned such that the front end 34 of the clutch plate 32 when extended, is spaced a certain, small distance from a free face 50 of the specimen support 18 which is placed on the inner part 16. The specimen support 18 is a generally washer-like aluminum part which is grounded electrically, for example, by using wire-like, very elastic wipers 56 running into an outside circumferential groove 58 (FIG. 2) and whose forces acting on the specimen support are so small that the small adjustment motion of the support in the X, Y and Z directions is in no way impeded and the fixing in position of the support in operation is not impaired.

The clutch plate 32 has on its lower side, which in the pulled-out or extended condition is opposite to the face 50 of the specimen support, a thin, insulating coating 52, and is insulatively, for example, by way of the bearing stones 44, 46 and 48, and is, by means of wiper or sliding contact, connected with an electric connection 29.

Figure 4:
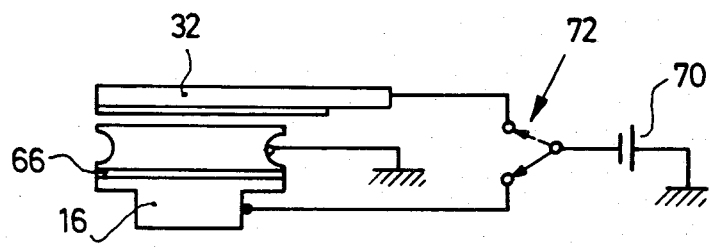
FIG. 4 is a schematic view of a circuit system for the system of FIGS. 1 to 3.

The turning inner part 16 is insulatively supported in the body, which is electrically grounded, of the goniometer rod 12 by using an insulating guide sleeve 60 (FIG. 2), and it is joined by way of a wiper system 62 with the clutch function change-over unit to be seen diagrammatically in FIG. 4. The wiper system may be designed, for example, resting against the lower face of a flange 64, which at its top face forms a support face for the specimen support 18. This support face has a thin insulating coating 66. The clutch plate 32 and the inner part 16 can, for example, be made of aluminum, in which case the insulating coatings 52 and 66, are then made of thin aluminum oxide coatings produced by anodic oxidation. Insulating coatings may also be provided on both sides of the specimen support.

The driving worm 19 maybe made of plastics or it, and the driving shaft 20, maybe made of metal, in which case, if the drive shaft is bearinged insulatively may be used for electrical connection of the turning inner part 16 in place of the wiper system 62.

In the following description of an adjustment operation it is assumed that the goniometer rod 12 with a specimen support placed on it is introduced into the electronmicroscope through an airlock and inserted into the specimen table. The general operation for adjustment is, however, not changed, as far as the invention is concerned, if the goniometer rod 12 is fixed in the apparatus. That is to say if the goniometer rod may not be taken out through an airlock, the specimen support 18 can be put into the apparatus in an other way using an airlock. In this case the apparatus 30 shown in FIG. 3 may be used as a specimen cartridge.

After the goniometer rod 12 (or the cartridge) has been put in position through the airlock with the specimen support 18, it is, if necessary, put into the zero angle of tilt position. Using the levers 24 and 26 the goniometer rod 12 with the sample support joined with it is then so moved in the X and Y directions that a desired part of the specimen is at a desired point with respect to the apparatus axis, which coincides with the Z axis that is to say, in the case of an eccentrical adjustment of the specimen at the point of intersection of the apparatus axis (which coincides with the turning axis 20) and the tilting axis 14. For the purpose of making these adjustment operations, the specimen support 18 is, coupled with the inner turning part 16. The friction force, produced by the weight of the specimen support may be sufficient for this, but, preferably, a voltage source 70 (FIG. 4) may be used for producing a voltage between the specimen support 18 and the inner turning part 16 with the effect that, because of the insulating layer 66 an electrostatic retaining force is produced which holds the specimen support 18 in position (this being necessary if the cartridge is put in through an airlock in a downward direction).

After getting the specimen into the true, desired position by adjustment of the specimen table 10, the specimen support 18 is decoupled from the inner turning part 16 and coupled with the clutch plate 32. To do this, the front end 34 of the clutch plate brought into contact with the face 50 of the specimen support 18 by energizing the piezoelectric unit 47 and then a voltage is applied between the clutch plate 32 and the specimen support 18 (position of the switch 72 in FIG. 4 shown in broken lines), this voltage causing a firm connection of the two parts together with a clutching effect. On de-energizing of the piezoelectric unit 47 the specimen support 18 is released from the inner turning part 16 and the specimen table 10 is moved by moving back or adjustment of the levers 24 and 26, back into its zero or resting position.

Now the specimen support 18 is moved down against the inner turning part 16 by energizing the piezoelectric unit 47 again, decoupled from the clutch plate 34 by turning off of the voltage and coupled to the inner turning part 16 again.

The specimen is now still in the position, established by the earlier adjustment, with respect to the apparatus axis and the goniometer rod is again in its zero position in which, for example, the tilt axis 14 goes through the apparatus axis and the turning or rotational axis 20 coincides with the apparatus axis.

If the specimen table 10 has means for adjustment of the goniometer rod in the Z-direction, the piezoelectric unit 47 can be dispensed with and the coupling and decoupling of the specimen support 14 with respect to the clutch plate 32 may be effected by a corresponding lifting or moving down of the goniometer rod with Z-adjustment.

It is naturally possible to use a mechanical clutch system, specifically for coupling the specimen support with the inner turning part instead of one or both of the electrostatic clutch systems described.

If, capacitive position sensing means and (which one known in the art) shown only schematically as 74 and 76, are provided for measuring the position of the specimen table 10 with respect to coordinates which are fixed in relation to the corpuscular beam apparatus, the couping-decoupling system of the invention may furthermore be used for moving the specimen, placed in the specimen support 18, through predetermined desired distances in the X-Y plane with respect to the specimen table 10. The position sensing means may also be used for controlled returning of the goniometer rod into an initially established position after later adjustment of the specimen, that is to say for the motion back into the old position of the levers 24 and 26 as noted earlier.

If the range of motion of the adjustment levers 24 and 26 is insufficient for a desired adjustment or motion, the clutch change-over operation (as described) may be repeated till the desired amount of adjustment or motion has been achieved.

The preferred embodiment of the invention shown in FIGS. 5 to 8 differs from the above described embodiment in that the specimen is mounted through an airlock into the electronmicroscope using a specimen cartridge 80 rather than by means of a goniometer rod. The electronmicroscope shown in part in axial section in FIG. 5, comprises a specimen table 10', which can be moved in the X and Y directions, and comprises an inner rotable turning part 16' for supporting and positioning a specimen cartridge 80, which, as known in the art, is inserted and removed through an airlock in and out of the electron microscope along a path 82. The turning part 16' has, on the top side of the specimen table 10', a flange with teeth 83 geared with a gearwheel 84, able to be rotated by a flexible hollow shaft 85 from the outside of the electron microscope. The specimen table 10' is supported on sliding ways 86, which are fixed on a pole plate 88 of an objective lens 90 of the electronmicroscope.

Figure 6:
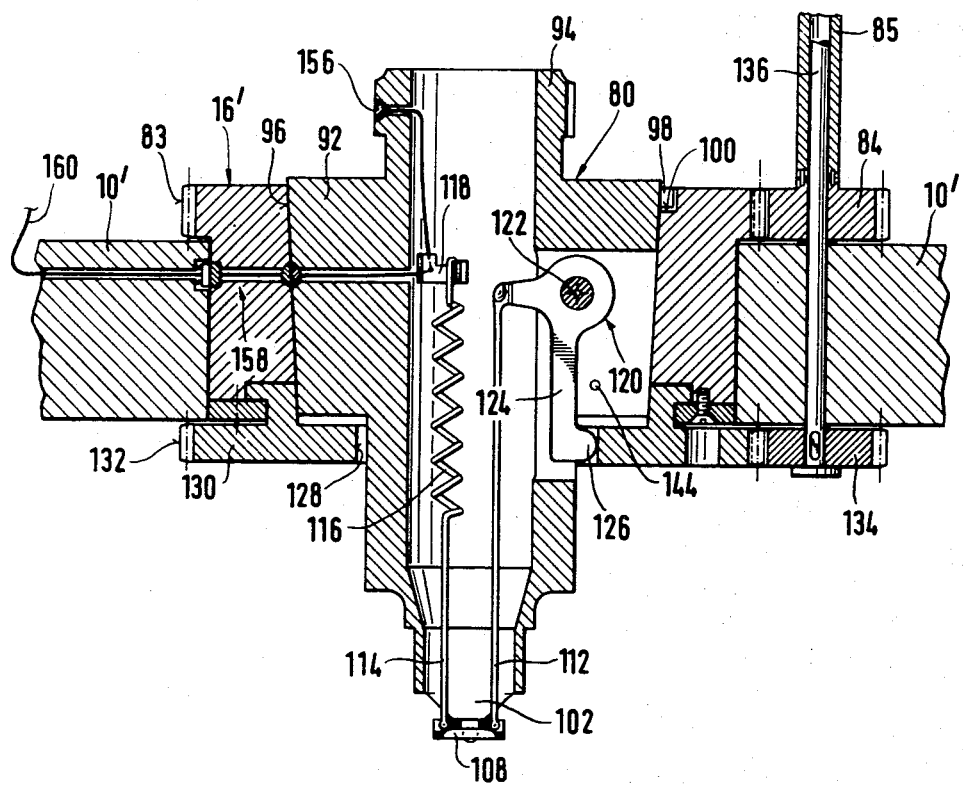
FIGS. 6, 7 and 8 are enlarged sectional views of the parts of the system of FIG. 5.
Figure 7:
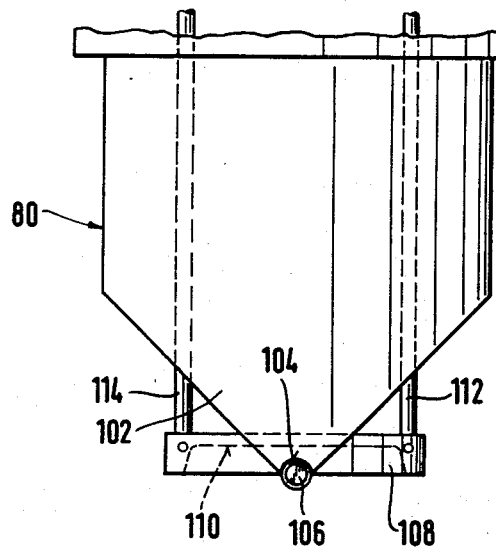
Figure 8:
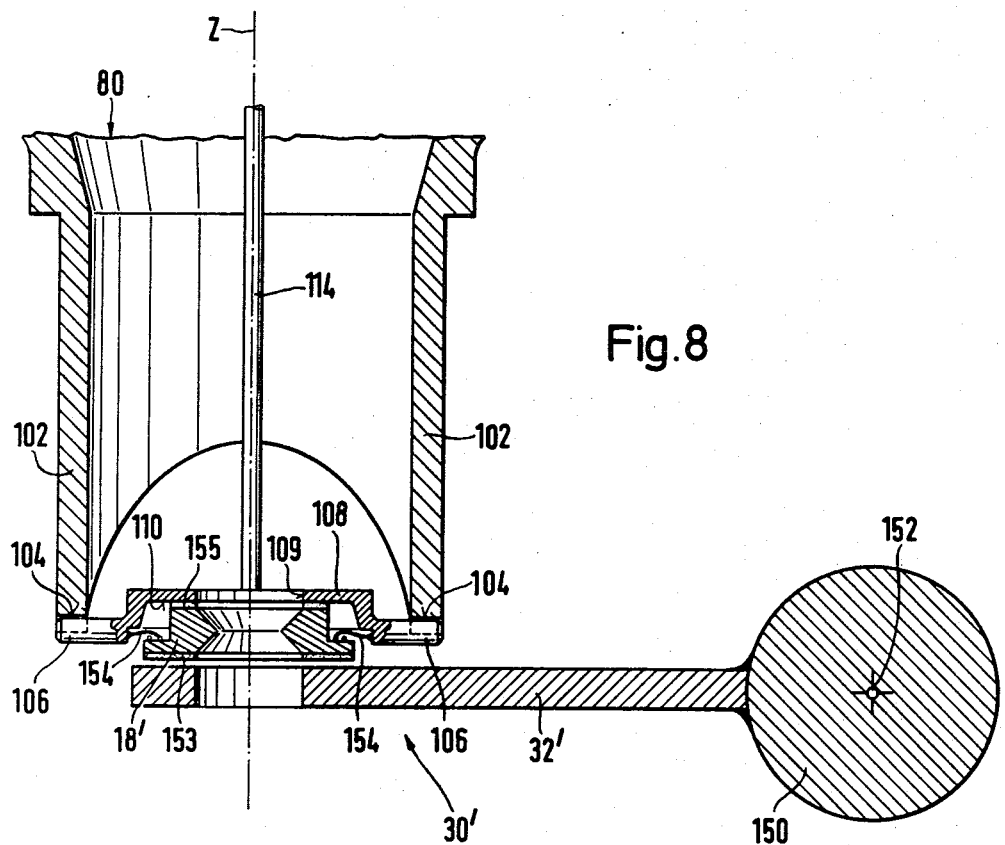

The specimen cartridge 80 is shown in more detail in FIGS. 6 to 8. It has a tubular body 92 which at the top has a head 94 for joining to the airlock system forming a seat face 96 tapering conically somewhat, for insertion in a hollow of the same form in the inner turning part 16'. The body 92 is provided with a key 98 which is received in a keyway or groove 100 in the turning part 16' to provide of a predetermined angular position of the cartridge 80 in relation to the inner turning part 16'.

At the lower, narrower end of the body 92 the last-named has two generally triangular feet 102, each of which have at their lower end a generally half-cylindrical bearing shell 104 for two short shafts 106 of a specimen support base 108, which has a central hole 109 and in its side facing downwards has a recession 110 forming a flat resting face or shoulder for a specimen support 18'. The last-named can be electrostatically coupled to the flat resting face, as explained below.

An upwardly running rod 112 and 114 is pivotally connected to diametrically opposite positions of the specimen support base 108, whose connection line is normal to the axis of the short shafts 106, in each case. The rod 114 is connected by way of a tension spring 116 with a shoulder 118 on the body 92. The other end of the rod 112 is pivotally connected with a first lever arm of a toggle lever 120, which is pivotally connected to a pin 122 in the body 92. The other lever arm 124 of the toggle lever 120 has, at its free end, a cam 126, resting against an inner face 128 of a cam ring 130 which is rotatably supported on the lower end of the inner part 16'. The inner face 128 has, in relation to the axis of rotation of the inner part 16', a spiral or heart-like form, so that on turning the cam ring 130 in relation to the inner part 16', the cam 126 may be moved to a greater or lesser degree outwards. The cam 126 is pushed by the spring 116 against the cam face 128. By turning the cam 130 the specimen support base 108 may be turned about the axis of the short shafts 106, for example through ±45 degrees. The cam ring 130 has on its outside teeth 132 with the same outer diameter and, preferably, the same pitch as the teeth 83 geared with a pinion 134, which is fixed on an inner shaft 136 coaxial with the hollow shaft. The inner shaft is connected by means of hollow shaft 85 to a knob 138 placed outside the vacuum housing of the electron microscope which, in turn, is used together with a bracket 140 that is fixed to the hollow shaft 85. The bracket 140 may be locked in position in relation to the button 138, by using a set screw 142. So by common turning of the knob 138 and the bracket 140, the inner part is turned without changing the angle of the specimen support base. If, on the other hand, the knob 138 which, for example, has a degree scale, is turned in relation to the bracket 140 having a pointer, the tilt of the specimen support base about the short shaft 104 may be changed without turning the inner part 16' and the specimen cartridge 80.

The motion of the lever arm 124 outwards may be so limited by stop 144 that the specimen cartridge may be inserted easily even if the knob 138 has been placed at the greatest possible tilt angle corresponding to the maximum position of the outward arm.

According to the invention further a simple clutch state change-over or coupling system 30' is provided, which, in line with the coupling system of FIGS. 1 to 4, operates electrostatically and allows a selective coupling of a specimen support 18' to the specimen support base 108 or to a simple clutch or supporting plate 32', which is attached on a shaft 150 supported rotably about an axis 152.

By change-over of the clutch state it is possible to first vary and adjust, as described above, the position of the specimen in the X/Y direction in relation to the axis of turning of the specimen cartridge 80 so that the specimen on the specimen support is moved into a desired position in relation to the Z-axis of the microscope while being coupled to the cartridge. Then the specimen support 18 may be coupled to the supporting plate 32' and be kept in position, while the specimen cartridge device is moved by means of its tilting into a desired position in relation to the electronmicroscope, e.g. into a position, in which the Z-axis of the microscope intersects the tilt axis established by the short shaft 106. Finally, the specimen support is again coupled to the cartridge and the desired measurements are made. As shown in FIG. 8, it is possible, because of the hollow or recession 110, that the tilt axis, established by the short shaft 106, goes through the specimen plane.

Figure 2:
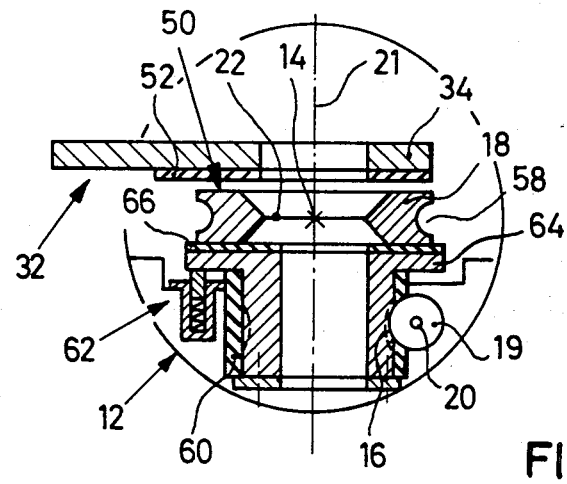
FIG. 2 is a section-view on a greater scale as seen in a plane II—II, of a part of the system of FIG. 1.

Further, the coupling system 30' may be used as well for changing the azimuthal angle of the specimen support 18' and, thus, of the specimen in relation to the tilt axis, so that only a single tilt axis is needed and in effect the same operation may be performed as with the turn-tilt system of FIGS. 1 to 3.

In the embodiment of the invention shown in FIGS. 5 to 8, the specimen support 18' is coated on both sides with a thin dielectric film 153 and 155 and has on its lower half as shown in FIG. 8 an outwardly bearing flange with an uncovered metallic face, contacted by thin wiper wires 154, which are connected with the short shafts 106 and, for this reason, are grounded. The specimen support base 108 may be of metal and in a way not shown, be insulated from the short shafts 106 and, thus, from ground, or on the resting face in the hollow or recession 110 may have an electrically conducting coating which is insulatively supported. The insulated specimen support base 108, or the coating forming its resting face, are electrically connected by way of parts 114 and 116 and 118 (insulated with respect to the body 92) on the one hand with a contact 156 placed on the head 94 of the body 92 (FIG. 6) and on the other hand by way of a contact and slip ring system 158 with a line 160. The contact 156 cooperates with an opposite contact (not shown) of the airlock system and allows a voltage with respect to ground to be applied to the resting face of the specimen support base 108 during insertion of the specimen thereby maintaining the specimen support 18' in position on the specimen support base 108 by electrostatic forces. The coupling plate 32' can be swung by the shaft 150 from the resting position shown in FIG. 5, in which it is turned back into a position pointing straight downwards, into a first working position (to be seen in FIG. 8), which is defined by a resiliently supported stop (not shown). In the first working position of FIG. 8 the clutch face, opposite to the insulating coating 153, of the clutch plate 32' is spaced by a small distance, of, for example a few tens of millimeters, from the coating 153. For change of the coupling state of the specimen support 18', i.e. to decouple it from the specimen support base 108 and couple it to the clutch plate 32' the clutch plate 32' is run up against the coating 153 of the specimen support 18' by turning the shaft 150 against the force produced by the resilient stop, and, if necessary, a voltage is applied between the specimen support, grounded by way of wires 154, on the one hand, and the clutch plate 32', which is appropriately insulated from ground, and the voltage to the specimen support base 108 is removed. The clutch plate 32' is then turned back from the second working position, wherein the clutch plate 32' contacts the specimen support 18', and the specimen support 18' contacts the specimen support base 108, into the first working position. The specimen support 18' is then moved along with the plate 32' and is, thereby unjoined or cleared from the specimen support base 108 so as to be spaced from it to some degree. It is now possible for the specimen cartridge 80 to be moved in the XY-plane and/or turned about is axis. The clutch plate 32' is then turned again into the second working position, in which the specimen support 18' again comes into contact with the specimen support base 108, and the voltage to the clutch plate 32' is switched off and the voltage to the specimen support base 108 is switched on, so that the specimen support 18' is now fixed by electrostatic forces on the specimen support base 108. The clutch plate 32' may now be turned back into its resting position shown in FIG. 5.

The specimen cartridge may be provided with known means with which the specimen support 18' is fixed mechanically on the specimen support base 108 in operation, if the existence of a voltage near the electron beam is undesired. Further, if necessary, tube-shaped grounded screens may be provided on the specimen support base 108 or the specimen support 18' for screening off of the effects of electrostatic fields from the beam.

Figure 5:
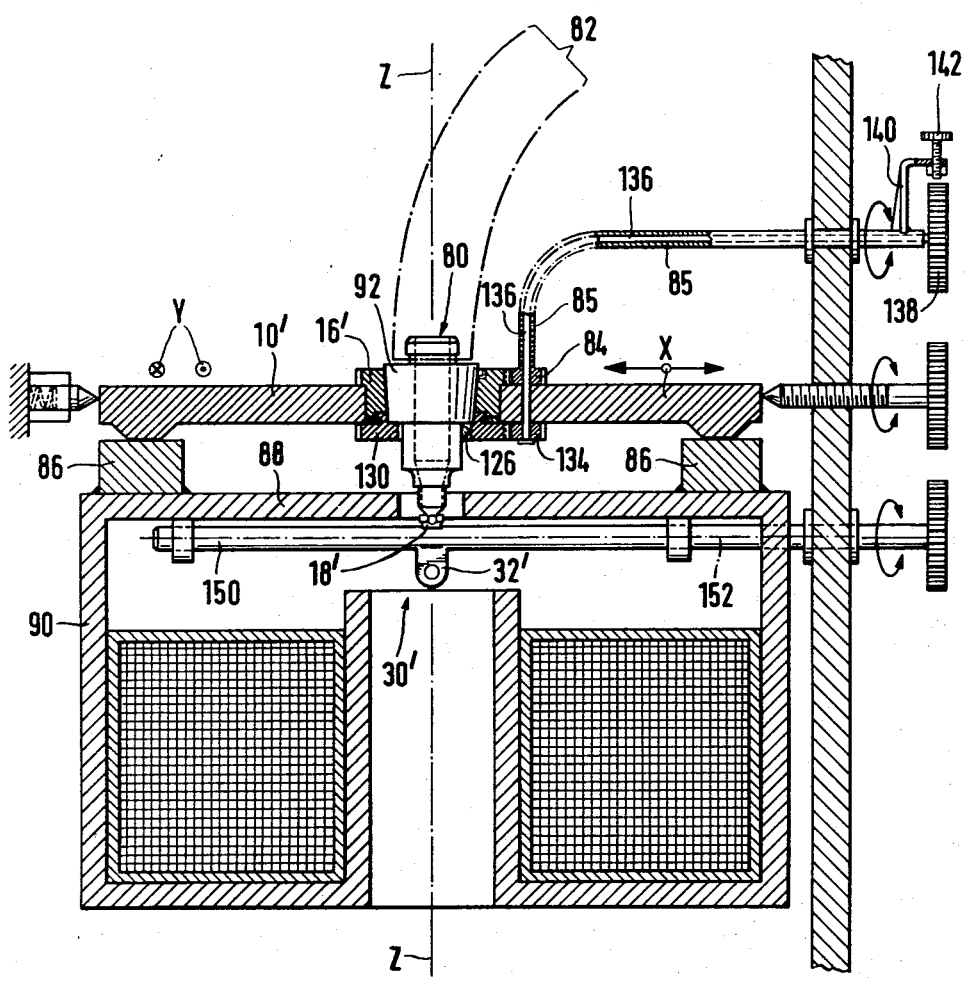
FIG. 5 is an axial section-view, put in a simpler form of the part of an electronmicroscope with a system according to a second embodiment of the invention.

The embodiment of the invention shown in FIGS. 5 to 7 may be modified by providing the cam ring 130 on the specimen cartridge.

A coupling system of the type shown in FIG. 5 may also be used in connection with a specimen cartridge provided with means for tilting the specimen about two axes which are normal to each other, and to the apparatus axis. Such specimen cartridge are known in the art. In this case the device for turning the specimen cartridge round the apparatus axes Z or an axis parallel to it is unnecessary.

I claim:

1. A method for adjusting a specimen supported by a specimen support of a corpuscular beam apparatus, such as an electronmicroscope, in relation to the axis of the beam of said apparatus, comprising the sequential steps of:

coupling said specimen support to a specimen table having at least one angular adjustment axis;

making a first adjustment of said specimen table in two coordinate directions in a plane normal to said beam axis so that a selected portion of said specimen intersects said beam axis;

releasing said specimen support from said table and coupling said specimen support to a support member which remains substantially in a fixed position in relation to said axis of said beam as determined by said first adjustment, as long as said specimen support is coupled to said support member;

making a second adjustment of said specimen table to align said angular adjustment axis with said beam axis; and returning said specimen support, which has been maintained by said support member in the position selected by said first adjustment, to said specimen table, whereby said specimen may be rotationally adjusted while maintaining said selected portion on said beam axis.

2. A method as described in claim 1, wherein said specimen table forms part of a goniometer which has a longitudinal axis (14) and an axis perpendicular to said longitudinal axis (21), so that, after said first adjustment of said specimen table has been made and said specimen support has been coupled to said support member, said specimen table may be adjusted into a position in which the point of intersection of said two goniometer axes is essentially on said apparatus axis.

3. A method as claimed in claim 1 or claim 2, wherein said coupling and decoupling of said specimen support is effected by moving said specimen table in a direction along said apparatus axis (Z).

4. A system for adjustment of a specimen in relation to a longitudinal beam axis in a corpuscular beam apparatus comprising:

a specimen table having means for adjustment in two directions normal with respect to said beam axis and having at least one angular adjustment axis;

a specimen support; and a coupling system for selectively coupling said specimen support alternatively to said specimen table and a support member (32) which member, but for some degrees of freedom of motion as needed during coupling and decoupling operations, is generally stationary when in operation for receiving or delivering said specimen support, said coupling system coupling said specimen support to said specimen table during a first adjustment of said table, whereby a selected position of said specimen intersects said beam axis, decoupling said specimen support from said table and coupling said specimen support to said support member during a second adjustment of said table to align said angular adjustment axis with said beam axis, and recoupling said specimen support to said table after said second adjustment, whereby said specimen may be rotationally adjusted while maintaining said selected portion on said beam axis.

5. A system as claimed in claim 4, wherein said support member (32) is movable between a first position, in which a coupling face on said support member is opposite to a resting face (50) of said specimen support, and a second position, in which said specimen support is freed by said support member from said specimen table.

6. A system as claimed in claim 5, wherein said support member (32) is provided with means (47), for being selectively positioned in contact with said resting face (50) of said specimen support (18).

7. A system as claimed in claim 5 or claim 6, wherein said support member (32) is supported to be movable only in the direction of said beam axis (Z) and along a line, which is in a plane normal to the apparatus axis, between two positions in each case.

8. A system for adjustment of a specimen in relation to the beam axis in a corpuscular beam apparatus, comprising a specimen table having means for adjustment in two directions normal to said beam axis and having at least one angular adjustment axis, a specimen cartridge adapted for insertion into said table from above through an airlock, a specimen support, and a device for turning said specimen through certain angles around each of two axes which are generally normal to each other, wherein a clutch plate (32') is provided which is supported so that it may be turned from below and contacted against the specimen support (18') of said specimen cartridge (80) and wherein a coupling is provided for selectively coupling said specimen support with said specimen cartridge and said clutch plate (32), said coupling system coupling said specimen support to said specimen cartridge during a first adjustment of said table whereby a selected portion of said specimen intersects said beam axis, said coupling system decoupling said specimen support and said cartridge and coupling said specimen support to said clutch plate during a second adjustment of said table to align said angular adjustment axis with said beam axis, and recoupling said specimen support to said cartridge after said second adjustment, whereby said specimen may be rotationally adjusted while maintaining said selected portion on said beam axis.

9. A system for adjustment of a specimen in relation to the beam axis in a corpuscular beam apparatus, comprising a specimen table adjustable in two directions normal with respect to each other and said beam axis and having at least one angular adjustment axis, a specimen cartridge adapted for insertion into the table through an airlock and including means for turning the specimen, wherein said specimen cartridge (80) has a generally tube-like catridge body (92) and is provided at its lower end with a specimen support base (108), and means for rotating said body around a single axis (106) which is essentially normal to the axis of said cartridge body, said specimen cartridge (80) further comprising means (83 and 84) for rotating said cartridge body around its axis and an axis generally parallel to said beam axis; and a coupling system (30') which includes a clutch plate (32') supported so that it may be turned to come up against the lower end of said cartridge (80) and means for selectively coupling a specimen support (18') with said clutch (32') and said specimen support base, said coupling system coupling said specimen support to said cartridge during a first adjustment of said table whereby a selected portion of said specimen intersects said beam axis, said coupling system decoupling said specimen support and said cartridge and coupling said specimen support and said clutch during a second adjustment of said table to align said angular adjustment axis with said beam axis, and recoupling said specimen support to said cartridge after said second adjustment, whereby said specimen may be rotationally adjusted while maintaining said selected portion on said beam axis.

10. A system as claimed in claim 9, wherein said specimen table (10) has an inner part (16'), which is supported for rotation about an axis parallel to the said beam axis (Z) and has an opening (96) for receiving said specimen cartridge (80) and comprising means (83,84) for turning said inner part, and means (128 to 138) for transmission of a force causing tilting of said specimen support base (108).

* * * * *

UNITED STATES PATENT AND TRADEMARK OFFICE
CERTIFICATE OF CORRECTION

PATENT NO. : 4,292,523

DATED : September 29, 1981

INVENTOR(S) : Walter Hoppe

It is certified that error appears in the above—identified patent and that said Letters Patent is hereby corrected as shown below:

```
Column 3, line 26, after "stones" insert a comma;
Column 3, line 49, after "insulatively" insert --supported--;
Column 3, line 67, "maybe" should read --may be--;
Column 3, line 68, "maybe" should read --may be--;
Column 4, line 28, delete the comma after "is";
Column 5, line 9, "one" should read --are--;
Column 6, line 56, "18" should read --18'--;
Column 7, line 55, after "thereby" insert a comma;
Column 7, line 59, "is axis" should read --its axis--;
Column 8, line 57, "apparatus" should read --beam--;
Column 8, line 61, "apparatus" should read --beam--;
Column 10, line 19, "catridge" should read --cartridge--;
Column 10, line 45, delete "the".
```

Signed and Sealed this

Twenty-ninth Day of December 1981

[SEAL]

Attest:

GERALD J. MOSSINGHOFF

Attesting Officer     Commissioner of Patents and Trademarks